United States Patent [19]

Kondou et al.

[11] Patent Number: 4,902,637
[45] Date of Patent: Feb. 20, 1990

[54] METHOD FOR PRODUCING A THREE-DIMENSIONAL TYPE SEMICONDUCTOR DEVICE

[75] Inventors: Harufusa Kondou; Masao Nakaya, both of Hyogo, Japan

[73] Assignee: Mitsubishi Denki Kabushiki Kaisha, Tokyo, Japan

[21] Appl. No.: 370,145

[22] Filed: Jun. 23, 1989

Related U.S. Application Data

[60] Continuation of Ser. No. 158,847, Feb. 22, 1988, abandoned, which is a division of Ser. No. 21,315, Mar. 3, 1987, abandoned.

[30] Foreign Application Priority Data

Mar. 3, 1986 [JP] Japan .................................. 61-45902

[51] Int. Cl.$^4$ ............................................. H01L 27/00
[52] U.S. Cl. ........................................ 437/51; 437/56;
437/194; 437/915; 437/200; 437/192;
148/DIG. 164; 357/23.7; 357/41; 357/71
[58] Field of Search ................. 437/51, 187, 56, 54,
437/192, 194, 197, 198, 196, 199, 200, 204, 915;
357/23.7, 23.9, 41, 71, 68; 148/Dig. 164

[56] References Cited

U.S. PATENT DOCUMENTS

| | | | |
|---|---|---|---|
| 3,323,198 | 6/1967 | Shortes | 357/68 |
| 4,358,339 | 11/1982 | Oeffinger et al. | |
| 4,479,297 | 10/1984 | Mizutani et al. | |
| 4,489,478 | 12/1984 | Sakurai | 357/23.7 |
| 4,498,226 | 2/1985 | Inoue et al. | 437/915 |
| 4,596,604 | 6/1986 | Akiyama et al. | |
| 4,612,083 | 9/1986 | Yasumoto et al. | 437/915 |

FOREIGN PATENT DOCUMENTS

| | | | |
|---|---|---|---|
| 0020135 | 12/1980 | European Pat. Off. | |
| 0168815 | 1/1986 | European Pat. Off. | 437/915 |
| 0125868 | 10/1981 | Japan | 357/23.7 |
| 0106158 | 7/1982 | Japan | 357/23.7 |
| 0056327 | 4/1983 | Japan | 437/915 |
| 0124261 | 7/1983 | Japan | 357/23.7 |
| 0004080 | 1/1984 | Japan | 437/915 |
| 0089953 | 5/1985 | Japan | 437/915 |
| 0234027 | 10/1986 | Japan | 437/200 |

OTHER PUBLICATIONS

Steinberger, H., Electronic 35(2):63–66 (1986) Jan., Munchen, Deutschland Cohen, Ch., Electronics International, p. 92, vol. 56 (1983) Sep., No. 19, New York, USA.
H. Shichijo et al., IEDM, Session 9.1, 1984, pp. 228–231, "Polysilicon Transistors in VLSI MOS Memories".

*Primary Examiner*—Brian E. Hearn
*Assistant Examiner*—M. Wilczewski
*Attorney, Agent, or Firm*—Lowe, Price, LeBlanc, Becker & Shur

[57] ABSTRACT

A method for producing a three-dimensional type semiconductor device comprises a first semiconductor integrated circuit layer comprising active regions, insulating layers, gate electrodes, and interconnection layers; an insulating layer formed thereon; and a second semiconductor integrated circuit layer comprising active regions, insulating layers, gate electrodes and interconnection layers. Active regions in the second layer are directly coupled to an interconnection layer, and active region and a gate electrode in the first layer, which are located immediately thereunder, by interlayer interconnections through a contact hole formed straight, so that a distance of each interlayer interconnection can be reduced.

8 Claims, 2 Drawing Sheets

METHOD FOR PRODUCING A THREE-DIMENSIONAL TYPE SEMICONDUCTOR DEVICE

This application is a continuation of application Ser. No. 07/158,847, filed Feb. 22, 1988, now abandoned, which is a divisional of U.S. application Ser. No. 021,315, filed Mar. 3, 1987, now abandoned.

BACKGROUND OF THE INVENTION

1. Field of the Invention

The present invention relates to a three-dimensional type semiconductor device and a method of producing the same, and more particularly, it relates to a three-dimensional type semiconductor device having a reduced distance of an interlayer interconnection, and a method of producing the same.

2. Description of the Prior Art

A three dimensional circuit having a reduced distance between semiconductor devices has been achieved as a three-dimensional type semiconductor device in these days. Such a three-dimensional circuit is disclosed in an article by H. Shichijo et al., entitled "POLYSILICON TRANSISTORS IN VLSI MOS MEMORIES", IEDM, SESSION 9.1, 1984, pp. 228-231.

FIG. 1 is a cross sectional view showing an example of a conventional three-dimensional type semiconductor device.

Referring now to FIG. 1, the structure of a conventional three-dimensional type semiconductor device is described.

In FIG. 1, an insulating layer 3 is formed on a first semiconductor integrated circuit layer 1 (referred to as a first layer), and a second semiconductor integrated circuit layer 2 (referred to as a second layer) is formed on the insulating layer 3.

More specifically, the first layer comprises active regions 12, insulating layers 13 and interconnection layers 11 for interconnecting the active regions 12 to each other. Each semiconductor elemental device comprises an MOS (Metal Oxide Semiconductor) transistor having a gate electrode 14. In addition, the second layer comprises active regions 22, insulating layers 23 and interconnection layers 21 for interconnecting the active regions 22 to each other. Each semiconductor elemental device comprises an MOS transistor having a gate electrode 24. The first and second layers are electrically connected to each other through a through-hole 4.

According to the conventional three-dimensional type semiconductor device shown in FIG. 1, in order to electrically couple the semiconductor elemental device included in the first layer to the semiconductor elemental device included in the second layer, an interlayer interconnection through the through-hole 4 must be utilized. For example, in FIG. 1, in order to electrically connect an active region 22b in the semiconductor elemental device included in the second layer to an active region 12b in the semiconductor elemental device included in the first layer, which is located immediately under the active region 22b, the through-hole 4 was provided laterally apart from the active regions in the semiconductor elemental devices and an interlayer interconnection through the through-hole 4 was applied. Thus, a distance of an interconnection for connecting semiconductor elemental devices in different layers was increased, so that a short distance between devices, which is one of the characteristics of the three-dimensional circuit, could not be made use of. More specifically, when the distance of an interconnection is thus increased, resistance and capacitance of interconnection could not be neglected, depending on materials for interconnection. Furthermore, since the through-hole is provided in a separate position apart from the semiconductor elemental devices, the conventional semiconductor device shown in FIG. 1 was very disadvantageous from the viewpoint of improvement of integration.

SUMMARY OF THE INVENTION

Briefly stated, the present invention provides a three-dimensional type semiconductor device comprising a first semiconductor integrated circuit layer including at least one first semiconductor elemental device having active regions, first insulating layers formed on the first semiconductor elemental device and first interconnection layers formed on the first insulating layers and connected to the active regions in the first semiconductor elemental device; a second insulating layer formed on the first semiconductor integrated circut layer; a second semiconductor integrated circuit layer formed on the second insulating layer and including at least one second semiconductor elemental device having active regions, third insulating layers formed on the second semiconductor elemental device and second interconnection layers formed on the third insulating layers and connected to the active regions in the second semiconductor elemental device; at least one contact hole formed straight to directly reach the first semiconductor integrated circuit layer from one of the active regions in at least one second semiconductor device; and at least one interlayer interconnection directly connecting one of the active regions in the second semiconductor elemental device to the first semiconductor integrated circuit layer through the contact hole.

In accordance with another aspect of the present invention, a method of producing a three-dimensional type semiconductor device comprises the steps of preparing a first semiconductor integrated circuit layer including at least one first semiconductor elemental device having active regions, first insulating layers formed on the first semiconductor elemental device and first interconnection layers formed on the first insulating layers and connected to the active regions in the first semiconductor elemental device; forming a second insulating layer on the first semiconductor integrated circuit layer; forming active regions which are to be included in at least one second semiconductor elemental device on the second insulating layer; forming at least one straight contact hole to directly reach the first semiconductor integrated circuit layer from one of the active regions in the at lease one second semiconductor elemental device; forming at least one interlayer interconnection directly connecting one of the active regions in the second semiconductor elemental device and the first semiconductor integrated circuit layer through the contact hole; forming third insulating layers on the second semiconductor elemental device; and forming second interconnection layers on said third insulating layers to be connected to the active regions in the second semiconductor elemental device.

Therefore, a primary object of the present invention is to provide a three-dimensional type semiconductor device having a reduced distance of an interconnection connecting semiconductor elemental devices included in different semiconductor integrated circuit layers to each other and a method of producing the same.

A principal advantage of the present invention is that since a contact hole and an interlayer interconnection are formed straight to directly reach a first semiconductor integrated circuit layer from one of active regions in semiconductor elemental devices included in a second semiconductor integrated circuit layer, a distance of the interlayer interconnection connecting the semiconductor elemental devices to each other can be reduced.

Another advantage of the present invention is that since a distance of an interlayer interconnection can be reduced, there occurs no problem due to resistance and capacitance of interconnection itself.

Still another advantage is that since a through-hole need not be provided in a separate position from semiconductor elemental devices, integration can be improved.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
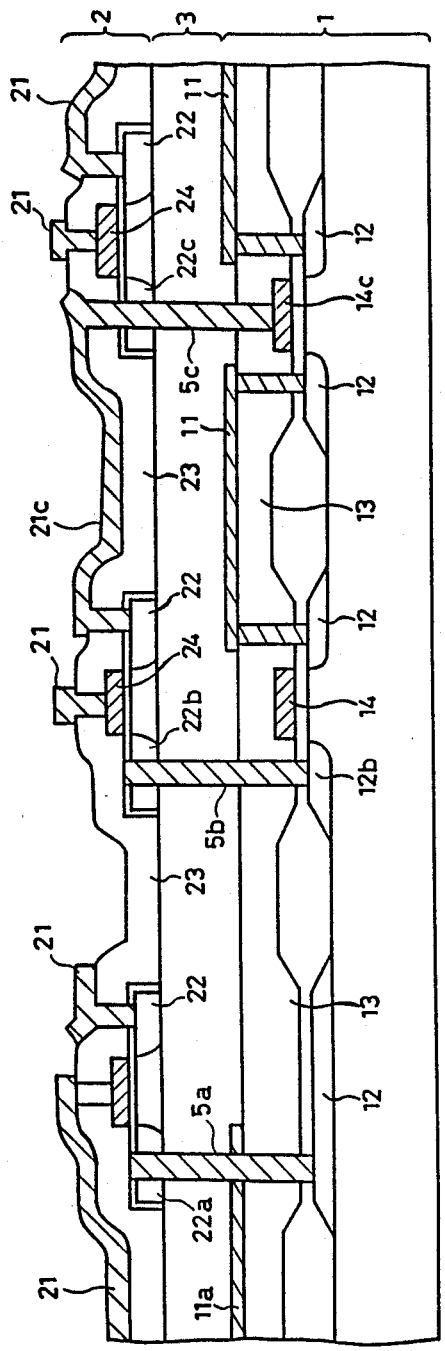
FIG. 2 is a cross-sectional view showing a three-dimensional type semiconductor device according to an embodiment of the present invention.

FIG. 2 is a cross-sectional view showing a three-dimensional type semiconductor device according to an embodiment of the present invention.

Referring now to FIG. 2, the structure of the three-dimensional type semiconductor device according to an embodiment of the present invention is described.

Figure 1:
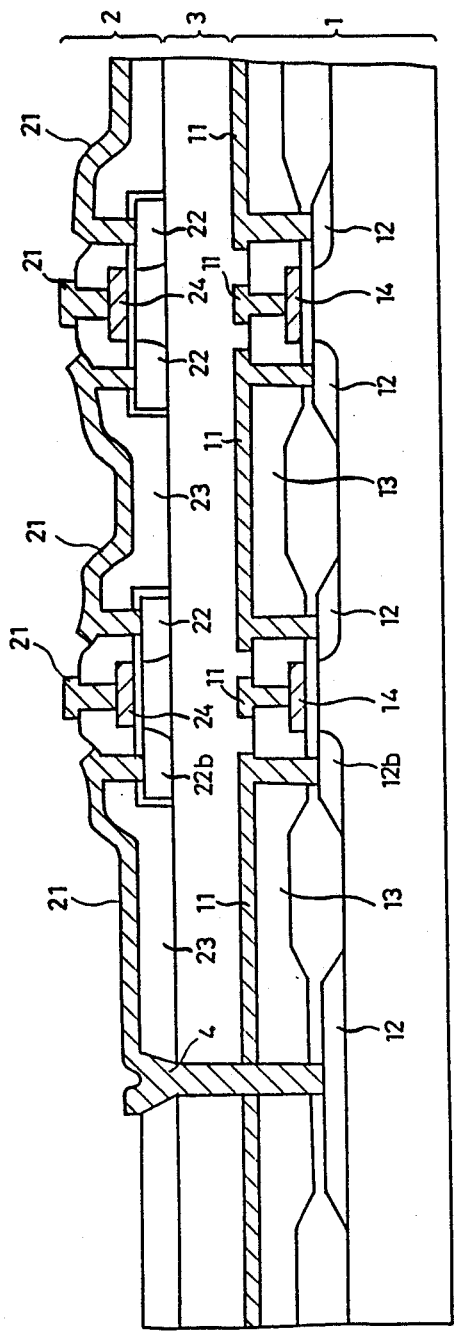
FIG. 1 is a cross-sectional view showing an example of a conventional three-dimensional type semiconductor device.

The three-dimensional type semiconductor device shown in FIG. 2 generally comprises a first semiconductor integrated circuit layer 1, an insulating layer 3 formed thereon and a second semiconductor integrated circuit layer 2 formed thereon, similarly to the conventional three-dimensional type semiconductor device shown in FIG. 1. More specifically, the first layer comprises active regions 12, insulating layers 13 and interconnection layers 11 for interconnecting the active regions 12 to each other, each semiconductor elemental device comprising an MOS transistor having a gate electrode 14. On the other hand, the second layer comprises active regions 22, insulating layers 23 and interconnection layers 21 for interconnecting the active layers 22 to each other, each semiconductor elemental device comprising an MOS, transistor having a gate electrode 24. According to an embodiment shown in FIG. 2, a through-hole is not formed in a position apart from the semiconductor elemental devices in each layer as shown in FIG. 1. Instead, there are formed a straight contact hole and an interlayer interconnection 5a for directly coupling an active region 22a in the second layer to an interconnection layer 11a in the first layer, a straight contact hole and an interlayer interconnection 5b for directly coupling an active region 22b in the second layer to an active region 12b in the first layer, and a straight contact hole and an interlayer interconnection 5c for directly coupling an active region 22c in the second layer to a gate electrode 14c of an MOS transistor in the first layer.

A manufacturing process of the three-dimensional type semiconductor device according to an embodiment of the present invention shown in FIG. 2 is now described.

A first semiconductor integrated circuit layer is formed by a conventional manufacturing process for an MOS device and then, the insulating layer 3 is formed by a silicon oxide film or the like.

A monocrystal silicon layer is formed on the insulating layer 3 and then, the semiconductor elemental device in the second layer is formed by a conventional manufacturing process for an MOS device.

A contact hole reaching the first semiconductor integrated circuit layer is made by reactive ion etching or the like. The contact hole is filled with aluminum, refractory metal silicide or the like by using sputtering, CVD (Chemical Vapour Deposition) or the like, so that interlayer interconnections 5a, 5b and 5c are formed. It is desirable that the interlayer interconnections 5a, 5b and 5c are perfectly embedded in the contact hole as shown in FIG. 2. However, in an actual manufacturing process, it is sufficient that the interlayer interconnections 5a, 5b and 5c and active regions 22a, 22b and 22c in the second layer are coupled on the wall surface of the respective active regions. Thus, the contact hole need not be perfectly filled as shown in FIG. 2.

The three-dimensional type semiconductor device shown in FIG. 2 is completed by forming the interconnection layers 21.

Operation of the three-dimensional type semiconductor device according to an embodiment of the present invention shown in FIG. 2 is now described.

According to the three-dimensional type semiconductor device shown in FIG. 2, since the active regions 22a, 22b and 22c in the second layer, and the interconnection layer 11a, the active region 12b and the gate electrode 14c in the first layer, which are located immediately under the active regions, respectively, are directly connected by the interlayer interconnections 5a, 5b and 5c through the contact holes formed straight, a distance between semiconductor elemental devices included in different semiconductor integrated circuit layers can be reduced, as compared with the case where they are connected through a through-hole formed in a separate position from the semiconductor elemental device as shown in FIG. 1. In addition, since the through-hole need not be provided in a separate position from the semiconductor elemental device, integration of the three-dimensional type semiconductor device can be improved.

Additionally, since a contact hole and an interlayer interconnection are formed after formation of the semiconductor elemental device in the second layer, steps are not formed and heterogeneous materials do not appear on the surface of the underlying insulating layer 3 when a monocrystal silicon layer in the second layer is formed, so that a monocrystal silicon layer of good quality can be easily formed on the insulating layer 3.

Although in the above described embodiment, a structure connected between two semiconductor integrated circuit layers is described, a structure connected between more than two layers is possible.

In addition, although in the above described embodiment, an MOS transistor is stacked as a semiconductor elemental device in each layer, a bipolar transistor and the other semiconductor device may be stacked, in which case the same effect can be obtained.

Furthermore, although in the above described embodiment, a contact hole and an interlayer interconnection are formed after formation of a second semiconductor layer including a semiconductor elemental device, a contact hole and an interlayer interconnection may be formed after formation of a monocrystal silicon layer in the second layer and prior to formation of a semiconductor elemental device in the second layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for producing a three-dimensional type semiconductor device comprising a first semiconductor integrated circuit layer, said first semiconductor integrated circuit layer including at least one first semiconductor elemental device having active regions, first insulating layers formed on said first semiconductor elemental device, and first interconnection layers formed on said first insulating layers and connected to the active regions in said first semiconductor elemental device, a second insulating layer formed on said first semiconductor integrated circuit layer, a second semiconductor integrated circuit layer formed on said second insulating layer, said second semiconductor integrated circuit layer including at least one second semiconductor elemental device having active regions, third insulating layers formed on said second semiconductor elemental device, and second interconnection layers formed on said third insulating layers and connected to the active regions in said second semiconductor elemental device, at least one contact hole formed straight to directly reach said first semiconductor integrated circuit layer from one of the active regions in said at least one second semiconductor elemental device, said contact hole penetrating the active region of said second semiconductor elemental device, and at least one interlayer interconnection directly connecting and penetrating one of the active regions in said second semiconductor elemental device and said first semiconductor integrated circuit layer through said contact hole, said method comprising preparing said first semiconductor integrated circuit layer including said at least one first semiconductor elemental device having a gate electrode and active regions, first insulating layers formed on said first semiconductor elemental device and said first interconnection layers formed on said first insulating layers and connected to the active regions in said first semiconductor elemental device, forming said second insulating layer on said first semiconductor integrated circuit layer, forming said active regions which are to be included in at said least one second semiconductor elemental device on said second insulating layer, forming said at least one straight contact hole to directly reach said first semiconductor integrated circuit layer from one of the active regions in said at least one second semiconductor elemental device, said contact hole formed so that it penetrates the active region of said second semiconductor elemental device and reaches at least one of said interconnection layer, said gate electrode and said active region in said first semiconductor integrated circuit layer, forming said at least one interlayer interconnection directly connecting one of the active regions in said semiconductor elemental device and said first semiconductor integrated circuit layer through said contact hole, forming said third insulating layers on said second semiconductor elemental device, and forming said second interconnection layers on said third insulating layers to be connected to the active regions in said second semiconductor elemental device.

2. The method of claim 1, wherein
said contact hole is formed by reactive ion etching.

3. The method of claim 1, wherein
said contact hole is formed to directly reach one of the active regions in the first semiconductor elemental device in said first semiconductor integrated circuit layer.

4. The method of claim 1, wherein
said first semiconductor elemental device comprises an MOS transistor having a gate electrode.

5. The method of claim 4, wherein
said contact hole is formed to directly reach the gate electrode of said MOS transistor.

6. The method of claim 1, wherein
said interlayer interconnection is formed of aluminum or refractory metal silicide.

7. The method of claim 6, wherein
said interlayer interconnection is formed of aluminum.

8. The method of claim 6, wherein
said interlayer interconnection is formed of refractory metal silicide.

* * * * *